(12) United States Patent
Park et al.

(10) Patent No.: US 9,479,101 B2
(45) Date of Patent: Oct. 25, 2016

(54) APPARATUS FOR DIAGNOSING FLUX OF MOTOR IN VEHICLE

(71) Applicant: Hyundai Motor Company, Seoul (KR)

(72) Inventors: Joo Young Park, Seoul (KR); Byung Hoon Yang, Gyeonggi-Do (KR)

(73) Assignee: Hyundai Motor Company, Seoul (KR)

( * ) Notice: Subject to any disclaimer, the term of this patent is extended or adjusted under 35 U.S.C. 154(b) by 23 days.

(21) Appl. No.: 14/557,876

(22) Filed: Dec. 2, 2014

(65) Prior Publication Data
US 2015/0349689 A1 Dec. 3, 2015

(30) Foreign Application Priority Data

May 28, 2014 (KR) .................. 10-2014-0064477

(51) Int. Cl.
| | | |
|---|---|---|
| *G01R 31/02* | (2006.01) | |
| *H02H 7/08* | (2006.01) | |
| *H02P 21/14* | (2016.01) | |
| *B60L 3/00* | (2006.01) | |
| *G01R 31/34* | (2006.01) | |
| *H02P 6/12* | (2006.01) | |

(52) U.S. Cl.
CPC ............ *H02P 21/14* (2013.01); *B60L 3/0061* (2013.01); *G01R 31/343* (2013.01); *H02P 29/0241* (2016.02); *H02P 6/12* (2013.01); *Y02T 10/642* (2013.01)

(58) Field of Classification Search
CPC ...... H02P 21/14; H02P 6/12; H02P 29/0241; G01R 31/343; B60L 3/0061
USPC .............................................. 318/400.21, 490
See application file for complete search history.

(56) References Cited

U.S. PATENT DOCUMENTS

| | | | |
|---|---|---|---|
| 2013/0134915 A1* | 5/2013 | Chung .................... | H02P 29/02 318/400.14 |
| 2014/0265960 A1* | 9/2014 | Sonoda ..................... | H02P 6/12 318/400.21 |

FOREIGN PATENT DOCUMENTS

| | | |
|---|---|---|
| JP | 2011-135762 | 7/2011 |
| KR | 10-2003-0015701 A | 2/2003 |
| KR | 10-0425729 | 4/2004 |
| KR | 10-0456850 | 11/2004 |
| KR | 10-2013-0050618 A | 5/2013 |
| KR | 10-1339239 | 9/2013 |

* cited by examiner

*Primary Examiner* — Bentsu Ro
*Assistant Examiner* — Zemenay Truneh
(74) *Attorney, Agent, or Firm* — Mintz Levin Cohn Ferris Glovsky and Popeo, P.C.; Peter F. Corless

(57) ABSTRACT

An apparatus for diagnosing motor performance of a vehicle and a method thereof are provided. The apparatus for diagnosing motor performance includes calculating magnetic flux of the motor under a predetermined diagnosis condition using a magnetic flux calculator. The apparatus further includes determining whether the calculated magnetic flux of the motor is included in a normal range using a validity determiner.

17 Claims, 7 Drawing Sheets

APPARATUS FOR DIAGNOSING FLUX OF MOTOR IN VEHICLE

CROSS-REFERENCE TO RELATED APPLICATION

This application is based on and claims the benefit of priority to Korean Patent Application No. 10-2014-0064477, filed on May 28, 2014, the disclosure of which is incorporated herein in its entirety by reference.

TECHNICAL FIELD

The present disclosure relates to an apparatus for diagnosing motor performance of a vehicle and a method thereof, and more particularly, to a technology that diagnoses performance of a motor generating driving power in a vehicle (such as a hybrid vehicle, an electric vehicle, a fuel cell vehicle, or the like).

BACKGROUND

Generally, a hybrid vehicle means a vehicle that obtains driving power by efficiently combining two or more power sources. However, in most cases, a hybrid vehicle means a vehicle that obtains driving power by an engine obtaining the driving power using fuel (e.g., petroleum gasoline) and an electric motor driven by the power of a battery. This is called a hybrid electric vehicle (HEV). The hybrid electric vehicle (hereinafter, abbreviated as hybrid vehicle) may form various structures using the engine and the electric motor as the power sources. Since the hybrid vehicle may simultaneously use mechanical and electrical energy, it has been widely adopted for vehicles or the like due to improved energy efficiency.

Related technology for diagnosing an electric motor abnormality (e.g., failure or error) discloses diagnosing the existence of an abnormality of the electric motor by collecting noise information from around a rotation shaft within the electric motor and then comparing the noise information with pre-stored abnormal noise information. However, the above technology may be vulnerable to surrounding noise and may be unable to diagnose abnormalities within the electric motor when no change occurs in the recorded noise even though abnormality exists in the electric motor.

SUMMARY

An aspect of the present disclosure provides an apparatus which may diagnose motor performance of a vehicle by monitoring magnetic flux of the motor due to the motor generating driving power in a hybrid vehicle, an electric vehicle, a fuel cell vehicle, or the like generally having a strong correlation with the magnetic flux, and a method thereof.

Another aspect of the present disclosure provides an apparatus for diagnosing motor performance of a vehicle. The apparatus may diagnose the performance by calculating magnetic flux of the motor under a predetermined diagnosis condition and then determine whether or not the calculated magnetic flux of the motor is included in a predetermined range, and a method thereof.

According to an exemplary embodiment of the present disclosure, an apparatus for diagnosing motor performance of a vehicle may include: a diagnosis instructing unit configured to instruct validity diagnosis of a motor; a voltage detector configured to detect a D axis voltage ($v_d$) and a Q axis voltage ($v_q$) which may be input to the motor in response to a diagnosis instruction from the diagnosis instructing unit; an angular velocity collector configured to collect angular velocity ($\omega$) of the motor based on the diagnosis instruction from the diagnosis instructing unit; a motor magnetic flux calculator configured to calculate magnetic flux ($\psi_F$) of the motor based on the D axis voltage, the Q axis voltage and the angular velocity of the motor; and a validity determiner configured to determine validity (e.g., when the magnetic flux of the motor calculated is within a predetermined range).

According to another exemplary embodiment of the present invention, a method for diagnosing motor performance of a vehicle may include: instructing, by a diagnosis instructing unit, validity diagnosis of a motor; detecting, by a voltage detector, a D axis voltage ($v_d$) and a Q axis voltage ($v_q$) which may be input to the motor in response to the diagnosis instruction; collecting, by an angular velocity collector, an angular velocity ($\omega$) of the motor in response to the diagnosis instruction; calculating, by a motor magnetic flux calculator, a magnetic flux ($\psi_F$) of the motor based on the D axis voltage, the Q axis voltage, and the angular velocity of the motor; and determining, by a validity determinator, that validity is present, when the calculated magnetic flux of the motor is within a predetermined range.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
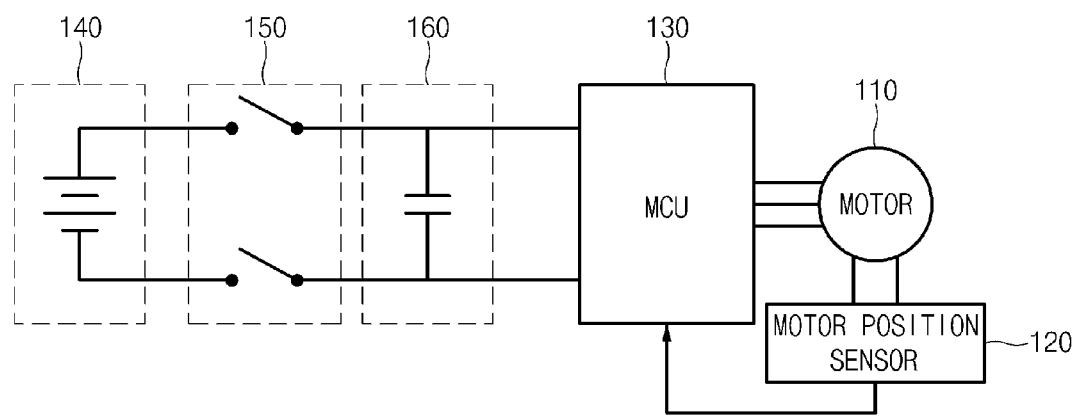
FIG. 1 is an exemplary configuration diagram of a system for diagnosing motor performance of a vehicle according to an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g.

fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, exemplary embodiments of the present disclosure will be described in detail with reference to the accompanying drawings.

FIG. 1 is an exemplary configuration diagram of a system for diagnosing motor performance of a vehicle according to an exemplary embodiment of the present invention. As shown in FIG. 1, the system for diagnosing motor performance may include a motor 110, a motor position sensor 120, a motor control unit (MCU) 130, a high voltage battery 140, a main relay 150, and a capacitor 160. The diagnosis system may be used for a hybrid vehicle, an electric vehicle, a fuel cell vehicle, and the like.

First, the motor 110 may be operated in response to a control of the MCU 130. The MCU 130 may include an inverter configured to convert a direct current (DC) into an alternating current (AC) having a variable frequency and a variable voltage, and a controller configured to adjust a current and a voltage. The motor position sensor 120 may be a resolver. For example, the motor position sensor 120 may be configured to transmit rotation position information regarding the motor 110 to the MCU 130 and the MCU 130 may be configured to control a current and a voltage to be supplied to the motor 110 based on the rotation position information.

Figure 2:
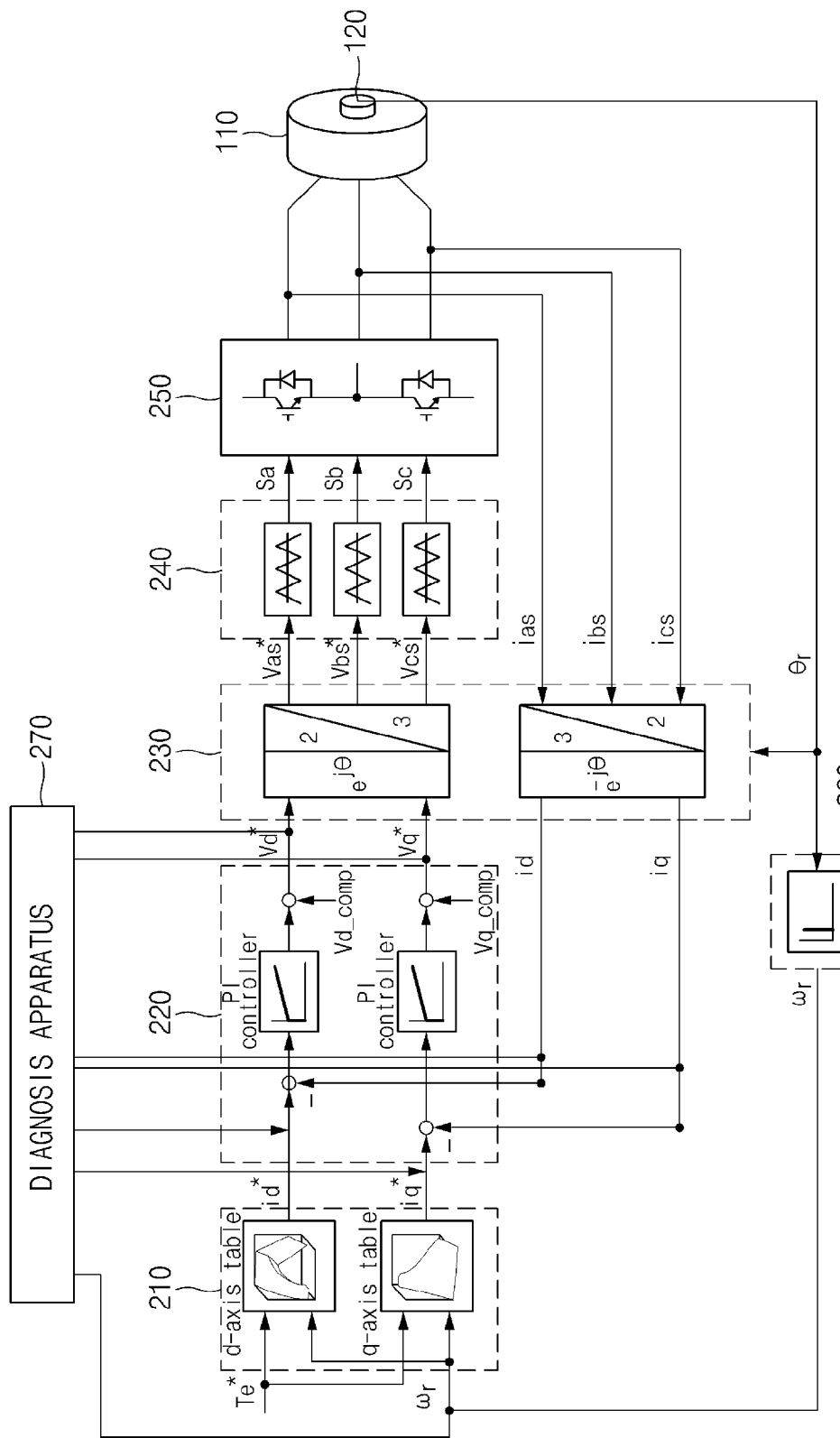
FIG. 2 is an exemplary detailed configuration diagram of a system for diagnosing motor performance of a vehicle according to an exemplary embodiment of the present invention.

FIG. 2 is an exemplary detailed configuration diagram of a system for diagnosing motor performance of a vehicle according to an exemplary embodiment of the present invention. Specifically, FIG. 2 is an exemplary circuit diagram of a controller in the MCU 130 configured to operate the motor. Referring to FIG. 2, the controller of the MCU 130 may include a current instruction generator 210, a current controller 220, an axis transformer 230, a pulse width modulation (PWM) generator 240, a PWM inverter 250, an angular velocity detector 260, and a diagnosis apparatus 270 configured to diagnose performance of the motor. When a torque instruction and a velocity instruction are received from an upper controller (not shown), the current instruction generator 210 may be configured to generate a D-Q axis current instruction and the current controller 220 may be configured to perform a current control so that an inverter current follows the current instruction. The axis transformer 230 may be configured to transform the D-Q axis current into a three-phase current or transform the three-phase current into the D-Q axis current, the PWM generator 240 may be configured to transfer a PWM switching signal to the PWM inverter 250 based on the current instruction, and the PWM inverter 250 may be configured to control the motor 110 based on the PWM switching signal. The angular velocity detector 260 may be configured to periodically detect the angular velocity of the motor using position information from the motor position sensor 120.

Further, the diagnosis apparatus 270 may be configured to determine a validity of magnetic flux of the motor using the torque instruction and the current instruction transferred from the upper controller (not shown), a motor current fed back from the motor, a monitored D-Q axis voltage, or the like. The diagnosis apparatus 270 may be configured to monitor the magnetic flux of the motor independent of an offset of the resolver by entering a performance diagnosis mode when the angular velocity of the motor is a predetermined value greater than 0 (e.g., when a vehicle is being driven), the D-Q axis current is about 0, and a motor torque is about 0. Here, the entrance into the performance diagnosis mode means a start of a process of calculating the magnetic flux of the motor.

Figure 3:
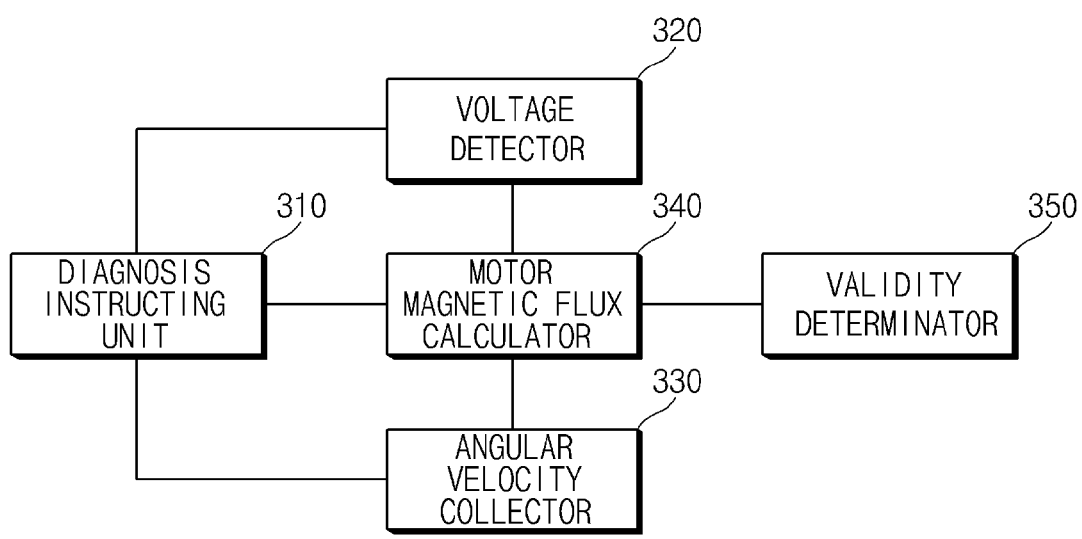
FIG. 3 is an exemplary configuration diagram of an apparatus for diagnosing motor performance of a vehicle according to an exemplary embodiment of the present invention.

FIG. 3 is an exemplary configuration diagram of an apparatus for diagnosing motor performance of a vehicle according to an exemplary embodiment of the present invention. As shown in FIG. 3, the apparatus for diagnosing the motor performance may include a diagnosis instructing unit 310, a voltage detector 320, an angular velocity collector 330, a motor magnetic flux calculator 340, and a validity determinator 350. A controller may be configured to execute the diagnosis instructing unit 310, the voltage detector 320, the angular velocity collector 330, the motor magnetic flux calculator 340, and the validity determinator 350. In particular, the diagnosis instructing unit 310 may be configured to determine whether the entrance into the performance diagnosis mode of the motor is performed and instruct the entrance when predetermined conditions are satisfied. In other words, the diagnosis instructing unit 310 may be configured to instruct an initiation of validity diagnosis of the motor.

The predetermined conditions are provided in the following Table 1.

TABLE 1

| | | | | | |
|---|---|---|---|---|---|
| Angular Velocity of Motor | ≠0 | =0 | =0 | ≠0 | ≠0 |
| Motor Requesting Torque | ≠0 | ≠0 | =0 | =0 | =0 |
| D-Q Axis Current of Motor | ≠0 | ≠0 | =0 | ≠0 | =0 |
| Enter or Not Enter Diagnosis Mode | Not Enter | Not Enter | Not Enter | Not Enter | Enter |

The voltage detector 320 may be configured to detect a D axis voltage ($v_d$) and a Q axis voltage ($v_q$) input to the axis transformer 230 in response to the diagnosis instruction from the diagnosis instructing unit 310. The angular velocity collector 330 may be configured to collect angular velocity of the motor, which is periodically transmitted by the angular velocity detector 260. In other words, the angular velocity collector 330 may be configured to collect the angular velocity ($\omega$) of the motor transmitted by the angular velocity detector 260 when the angular velocity detector 260 receives the diagnosis instruction from the diagnosis instructing unit 310. The motor magnetic flux calculator 340 may be configured to calculate a magnetic flux ($\psi_F$) of the motor based on the D axis voltage ($v_d$), the Q axis voltage ($v_q$), and the angular velocity ($\omega$) of the motor. In particular, the motor magnetic flux calculator 340 uses the following equation:

$$\Psi_F = \frac{\sqrt{v_d^2 + v_q^2}}{\omega} \quad \text{Equation 1}$$

wherein $\psi_F$ means the magnetic flux of the motor, $v_d$ means the D axis voltage, $v_q$ means the Q axis voltage, and $\omega$ means the angular velocity of the motor.

The validity determinator 350 may be configured to determine whether the motor may function normally (e.g., without error). In other words, the validity determinator 350 may be configured to determine whether validity is present when the magnetic flux calculated by the motor magnetic flux calculator 340 is in a predetermined range. Furthermore, the predetermined range may vary based on a type of motor.

Figure 4:
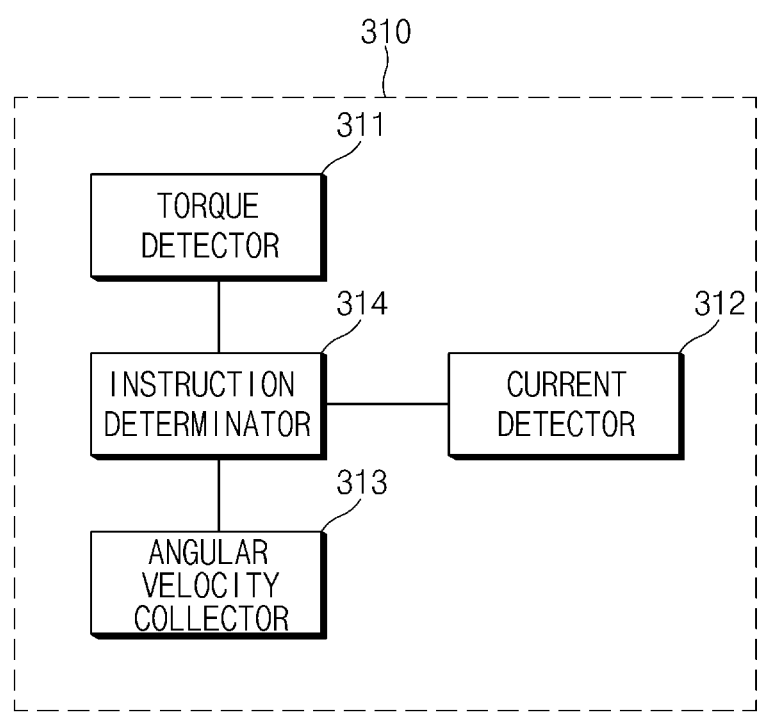
FIG. 4 is an exemplary configuration diagram of a diagnosis instructing unit according to an exemplary embodiment of the present invention.

FIG. 4 is an exemplary configuration diagram of a diagnosis instructing unit according to an exemplary embodiment of the present invention. As shown in FIG. 4, the diagnosis instructing unit 310 may include a torque detector 311, a current detector 312, an angular velocity collector 313, and an instruction determinator 314. The controller may be configured to execute the torque detector 311, the current detector 312, the angular velocity collector 313, and the instruction determinator 314.

Figure 5:
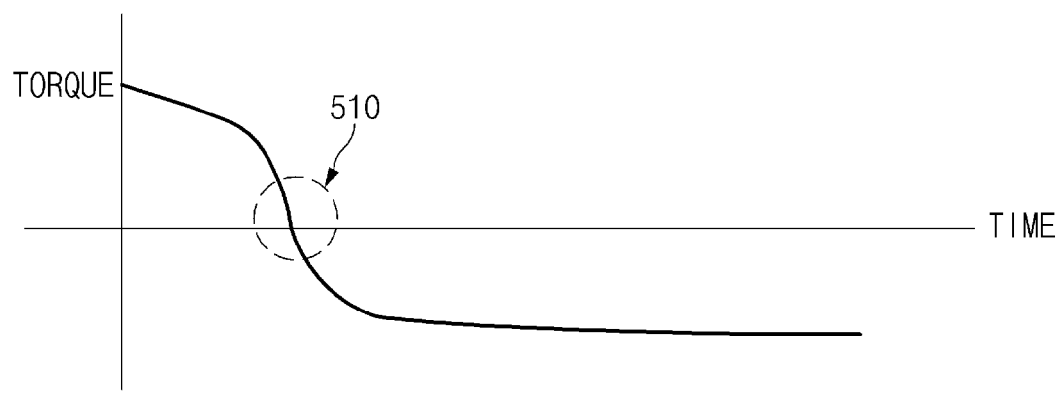
FIG. 5 is an exemplary illustration diagram illustrating a timing of diagnosing performance of the motor according to an exemplary embodiment of the present invention.
Figure 6:
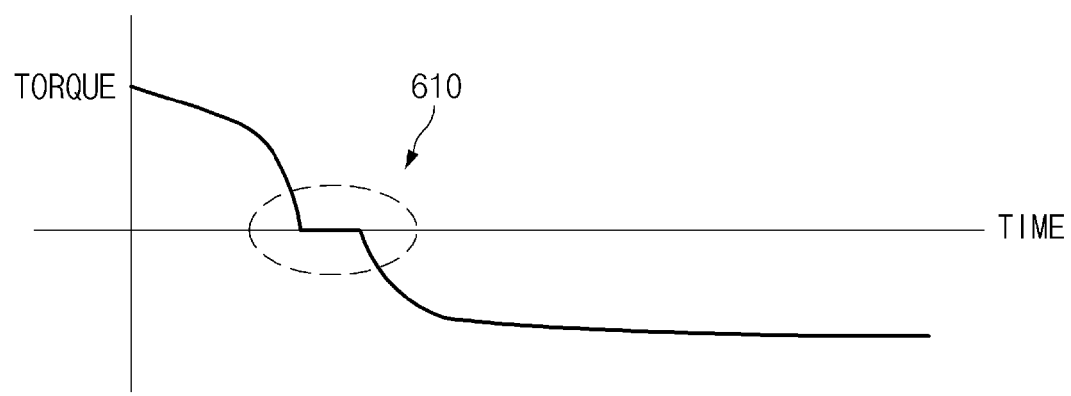
FIG. 6 is another exemplary illustration diagram illustrating a timing of diagnosing performance of the motor according to an exemplary embodiment of the present invention.

The torque detector 311 may be configured to detect a requested motor torque (motor requesting torque). Additionally, the current detector 312 may be configured to detect a D axis current and a Q axis current input to the motor. The angular velocity collector 313 may be configured to collect an angular velocity of the motor periodically transmitted from the angular velocity detector 260. The instruction determinator 314 may be configured to instruct an initiation of a diagnosis mode when the motor requesting torque is about 0, the D-Q axis current is about 0, and the angular velocity of the motor is not equal to 0 ($\omega \neq 0$) (e.g., greater than). Additionally, the instruction determinator 314 may further be configured to determine whether a motor current fed back from the motor is about 0 (whether being converged) and instruct the initiation of the diagnosis mode when the motor current is about 0. These actions may be performed at a time shown in FIG. 5 as 510, in which the motor requesting torque is about 0, may marginally increase the time the motor torque is about 0. In other words, as shown in FIG. 6, the number of times a diagnosis may be executed may be increased by having an interval 610 and making it possible to increase accuracy of the diagnosis. Accordingly, a torque controller (not shown) may also be included. Accordingly, the torque controller may be configured to maintain a 0 torque during a preset time at when the motor torque becomes 0.

Figure 7:
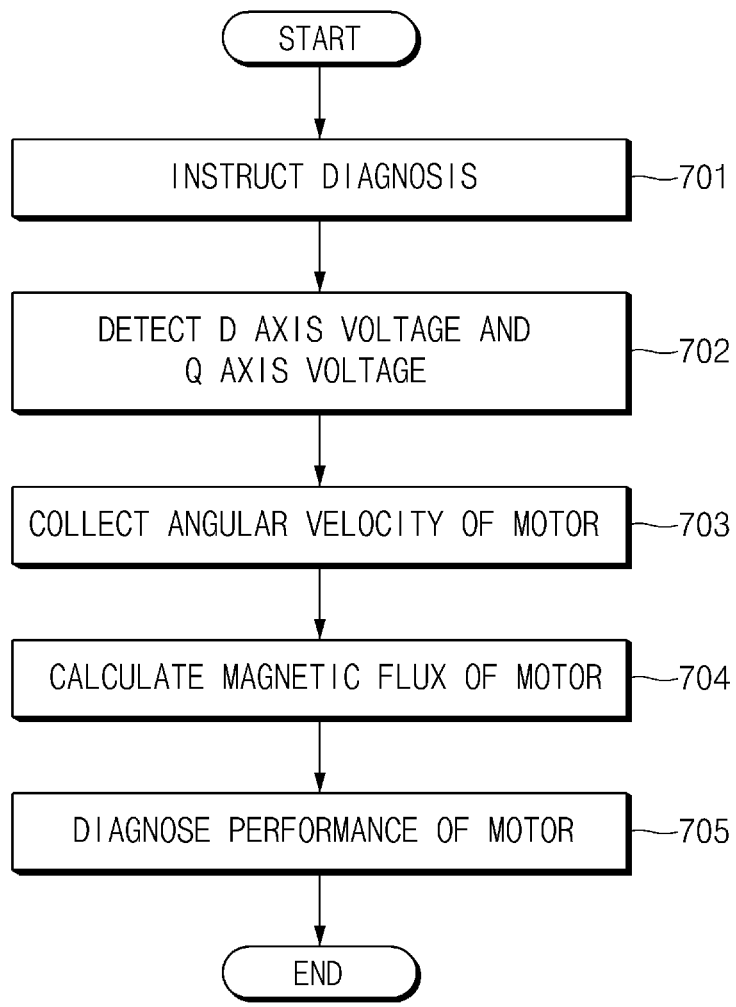
FIG. 7 is an exemplary flow chart of a method for diagnosing motor performance of a vehicle according to an exemplary embodiment of the present invention.

FIG. 7 is an exemplary flow chart of a method for diagnosing motor performance of a vehicle according to an exemplary embodiment of the present invention. First, the diagnosis instructing unit 310 may be configured to instruct validity diagnosis of the motor (701). Next, the voltage detector 320 may be configured to detect a D axis voltage ($v_d$) and a Q axis voltage ($v_q$) input to the motor in response to the diagnosis instruction from the diagnosis instructing unit 310 (702). In addition, the angular velocity collector 330 may be configured to college an angular velocity ($\omega$) of the motor in response to the diagnosis instruction. The motor magnetic flux calculator 340 may be configured to calculate a magnetic flux ($\psi_F$) of the motor based on the D axis voltage ($v_d$), the Q axis voltage ($v_q$), and the angular velocity ($\omega$) of the motor. The validity determinator 350 may be configured to determine that validity is present, when the magnetic flux ($\psi_F$) of the motor is within a predetermined range (705). The validity determinator 350 may also be configured to determine that validity of the motor is not present, when the magnetic flux of the motor is beyond the predetermined range.

As described above, the magnetic flux of the motor may be monitored independently of an offset of the resolver by calculating the magnetic flux of the motor when a predetermined diagnosis condition is met and then determining whether the calculated magnetic flux is in the predetermined range.

Although the present invention has been described with reference to exemplary embodiments illustrated in the drawings for illustrative purposes, those skilled in the art will appreciate that various modifications and equivalent embodiments are possible, without departing from the scope and spirit of the invention. Accordingly, the substantial technical protection scope of the present invention will be defined by the appended claims.

What is claimed is:

1. An apparatus for diagnosing a flux of a motor in a vehicle, comprising:
    a memory configured to store program instructions; and
    a controller configured to execute the program instructions, the program instructions when executed configured to:
       detect a D axis voltage ($v_d$) and a Q axis voltage ($v_q$), which are input to the motor in response to a diagnosis instruction from a diagnosis instructing unit;
       collect angular velocity ($\omega$) of the motor in response to the diagnosis instruction;
       start a diagnosis mode when a motor torque is about 0, a D-Q axis current input to the motor is about 0, and the angular velocity of the motor is greater than 0;
       calculate a magnetic flux ($\psi_F$) of the motor based on the D axis voltage, the Q axis voltage, and the angular velocity; and
       determine validity of the motor when the magnetic flux is within a predetermined range that varies based on a type of the motor.

2. The apparatus according to claim 1, wherein the program instructions when executed are further configured to store the predetermined range that varies based on the type of the motor.

3. The apparatus according to claim 1, wherein the program instructions when executed are further configured to calculate the magnetic flux ($\psi_F$) using the following equation:

$$\Psi_F = \frac{\sqrt{v_d^2 + v_q^2}}{\omega}$$

wherein, $\psi_F$ is the magnetic flux of the motor, $v_d$ is the D axis voltage, $v_q$ is the Q axis voltage, and $\omega$ the angular velocity of the motor, respectively.

4. The apparatus according to claim 1, wherein the program instructions when executed are further configured to:
detect the motor torque;
detect a D axis current and a Q axis current input to the motor;
collect the angular velocity of the motor; and
start the diagnosis mode when the motor torque is about 0, the D-Q axis current is about 0, and the angular velocity of the motor is greater than 0.

5. The apparatus according to claim 4, wherein the program instructions when executed are further configured to:
determine when the motor current is about 0; and
instruct the start of the diagnosis mode when the motor current is about 0.

6. The apparatus according to claim 1, wherein the program instructions when executed are further configured to maintain a 0 torque during a preset time when the motor torque becomes 0.

7. A method for diagnosing a flux of a motor in a vehicle, the method comprising:
detecting, by a controller, a D axis voltage ($v_d$) and a Q axis voltage ($v_q$) which are input to the motor in response to a diagnosis instruction;
collecting, by the controller, angular velocity ($\omega$) of the motor according to the diagnosis instruction;
starting, by the controller, a diagnosis mode when a motor torque is about 0, a D-Q axis current input to the motor is about 0, and the angular velocity of the motor is greater than 0;
calculating, by the controller, a magnetic flux ($\psi_F$) of the motor based on the D axis voltage, the Q axis voltage, and the angular velocity; and
determining, by the controller, validity of the motor when the magnetic flux is within a predetermined range that varies based on a type of the motor.

8. The method according to claim 7, wherein the determining of the validity includes:
storing, by the controller, the predetermined range that varies based on the type of the motor.

9. The method according to claim 7, wherein in the calculating of the magnetic flux of the motor, the magnetic flux ($\psi_F$) is calculated using the following equation:

$$\Psi_F = \frac{\sqrt{v_d^2 + v_q^2}}{\omega}$$

wherein, $\psi_F$ is the magnetic flux of the motor, $v_d$ is the D axis voltage, $v_q$ is the Q axis voltage, and $\omega$ is the angular velocity of the motor.

10. The method according to claim 7, wherein the instructing of the validity diagnosis includes:
determining, by the controller, when the motor current is about 0; and
starting, by the controller, the diagnosis mode to start when the motor current fed back from the motor is 0.

11. The method according to claim 7, wherein the instructing of the validity diagnosis includes:
maintaining, by the controller, a 0 torque during a preset time when the motor torque becomes 0 using a torque controller.

12. A non-transitory computer readable medium containing program instructions executed by a controller, the computer readable medium comprising:
program instructions that detect a D axis voltage ($v_d$) and a Q axis voltage ($v_q$) input to a motor in response to a diagnosis instruction;
program instructions that detect an angular velocity ($\omega$) of the motor in response to the diagnosis instruction;
program instructions that start a diagnosis mode when a motor torque is about 0, a D-Q axis current input to the motor is about 0, and the angular velocity of the motor is greater than 0
program instructions that calculate a magnetic flux ($\psi_F$) of the motor based on the D axis voltage, the Q axis voltage, and the angular velocity; and
program instructions that determine validity of the motor when the magnetic flux is within a predetermined range that varies based on a type of the motor.

13. The non-transitory computer readable medium according to claim 12, wherein the determining of validity further includes program instructions that store the predetermined range that varies based on a type of the motor.

14. The non-transitory computer readable medium according to claim 13, wherein the calculating of the magnetic flux further includes program instructions that calculate the magnetic flux using the following equation:

$$\Psi_F = \frac{\sqrt{v_d^2 + v_q^2}}{\omega}$$

wherein, $\psi_F$ is the magnetic flux of the motor, $v_d$ is the D axis voltage, $v_q$ is the Q axis voltage, and $\omega$ is the angular velocity of the motor.

15. The non-transitory computer readable medium according to claim 12, further comprising:
program instructions that detect the motor torque;
program instructions that detect a D axis current and a Q axis current input to the motor;
program instructions that collect the angular velocity of the motor; and
program instructions that start the diagnosis mode when the motor torque is about 0, the D-Q axis current is about 0, and the angular velocity of the motor is greater than 0.

16. The non-transitory computer readable medium according to claim 15, wherein the instructing of validity diagnosis further includes:
program instructions that determine when the motor current is about 0; and
program instructions that the diagnosis mode to start when the motor current is 0.

17. The non-transitory computer readable medium of claim 15, wherein the instructing of validity diagnosis further includes program instructions that maintain a 0 torque during a preset time when the motor torque becomes 0 using a torque controller.

\* \* \* \* \*